United States Patent
Furukawa et al.

(10) Patent No.: US 11,942,512 B2
(45) Date of Patent: Mar. 26, 2024

(54) SEMICONDUCTOR DEVICE AND POWER CONVERSION DEVICE

(71) Applicant: Hitachi Power Semiconductor Device, Ltd., Ibaraki (JP)

(72) Inventors: Tomoyasu Furukawa, Tokyo (JP); Daisuke Kawase, Ibaraki (JP)

(73) Assignee: HITACHI POWER SEMICONDUCTOR DEVICE, LTD., Hitachi (JP)

( * ) Notice: Subject to any disclaimer, the term of this patent is extended or adjusted under 35 U.S.C. 154(b) by 472 days.

(21) Appl. No.: 17/241,631

(22) Filed: Apr. 27, 2021

(65) Prior Publication Data
US 2021/0367028 A1 Nov. 25, 2021

(30) Foreign Application Priority Data
May 25, 2020 (JP) .................................. 2020-090325

(51) Int. Cl.
*H01L 29/06* (2006.01)
*H01L 29/40* (2006.01)
(Continued)

(52) U.S. Cl.
CPC ...... *H01L 29/0623* (2013.01); *H01L 29/0638* (2013.01); *H01L 29/402* (2013.01);
(Continued)

(58) Field of Classification Search
CPC ............. H01L 29/0623; H01L 29/0638; H01L 29/7397; H01L 23/3157; H01L 29/404;
(Continued)

(56) References Cited

U.S. PATENT DOCUMENTS 9,355,958 B2   5/2016 Schäffer et al.
2011/0220917 A1   9/2011 Hayashi et al.
(Continued)

FOREIGN PATENT DOCUMENTS

EP        0703627 A1    3/1996
JP     2010-251404 A   11/2010
(Continued)

OTHER PUBLICATIONS

Extended European Search Report for European Application No. 21173997.4 dated Oct. 19, 2021.
(Continued)

*Primary Examiner* — Shahed Ahmed
(74) *Attorney, Agent, or Firm* — MATTINGLY & MALUR, PC

(57) ABSTRACT

A termination structure in which a semiconductor active region is surrounded with a guard ring and capable of preventing corrosion of a metal layer connected to the guard ring includes: an active region and a guard ring region surrounding the active region. A guard ring is formed on the semiconductor substrate, and an interlayer insulating film is formed on the semiconductor substrate so as to cover the guard ring. A field plate is disposed on the interlayer insulating film and is electrically connected to the guard ring via a contact penetrating the interlayer insulating film. A protective film covers the field plate, which has a laminated structure including a first metal in contact with the guard ring and a second metal which is disposed in contact with the first metal and has a lower standard potential than the first metal.

10 Claims, 10 Drawing Sheets

(51) Int. Cl.
    *H01L 29/739*     (2006.01)
    *H02M 7/5387*    (2007.01)
    *H02P 27/06*     (2006.01)

(52) U.S. Cl.
    CPC ...... *H01L 29/7397* (2013.01); *H02M 7/5387* (2013.01); *H02P 27/06* (2013.01)

(58) Field of Classification Search
    CPC ............... H01L 29/1095; H01L 29/417; H01L 29/0619; H01L 29/0603; H01L 29/41; H01L 29/66325–66348; H01L 29/7393–7398; H01L 29/083–0834; H01L 29/402–407; H02M 7/5387; H02P 27/06
    See application file for complete search history.

(56) References Cited

U.S. PATENT DOCUMENTS

| | | |
|---|---|---|
| 2015/0187870 A1 | 7/2015 | Agata et al. |
| 2016/0043013 A1 | 2/2016 | Roth et al. |
| 2017/0365669 A1* | 12/2017 | Kim .................... H01L 29/0623 |
| 2018/0226400 A1 | 8/2018 | Shinsho |
| 2021/0074845 A1* | 3/2021 | Hoshi ................. H01L 29/1095 |

FOREIGN PATENT DOCUMENTS

| | | |
|---|---|---|
| JP | 2011-100811 A | 5/2011 |
| JP | 2012-4466 A | 1/2012 |
| JP | 2014-49694 A | 3/2014 |
| JP | 2014-175640 A | 9/2014 |
| WO | 2011/027523 A1 | 3/2011 |
| WO | 2014/084124 A1 | 6/2014 |

OTHER PUBLICATIONS

Standard electrode potential (data page); Internet citation, dated Feb. 10, 2011, 2011; XP-002621690, 8 pages.

Japanese Office Action received in corresponding Japanese Application No. 2020-090325 dated Dec. 19, 2023.

* cited by examiner

SEMICONDUCTOR DEVICE AND POWER CONVERSION DEVICE

CLAIM OF PRIORITY

The present application claims priority from Japanese Patent application serial no. 2020-090325, filed on May 25, 2020, the content of which is hereby incorporated by reference into this application.

BACKGROUND OF THE INVENTION

1. Field of the Invention

The present invention relates to a structure of a semiconductor device, and more particularly to a technique to be effectively applied to a semiconductor device having a termination structure in which a semiconductor active region is surrounded with a guard ring.

2. Description of the Related Art

Semiconductor devices are used in a wide range of fields such as system Large Scale Integration (LSI), power conversion devices, and control devices for hybrid vehicles and electric vehicles. For example, an Insulated Gate Bipolar Transistor (hereinafter abbreviated as IGBT) module, which is a main component of a power conversion device such as an inverter, is used for railways, electric power, and electric vehicles, and a power module is required to be highly reliable even in a hot and humid environment in addition to low in cost and small in size. Similarly, for a power device chip in the power module, a new technology that realizes high reliability in a hot and humid environment in addition to low cost and small size is also required.

With such a background, as a technique for reducing a size of a termination structure in which an active region of a power device chip is surrounded, for example, JP-A-2010-251404 (Patent Literature 1) proposes a technique in which a laminated structure including a barrier metal layer connected to a guard ring and a field electrode is provided, and a part of the barrier metal layer protrudes from both sides of the field electrode in a direction crossing the termination region.

Accordingly, both higher withstand voltage and small size can be achieved.

In addition, FIG. 19 of JP-A-2011-100811 (Patent Literature 2) shows a technique in which a Schottky Barrier Diode (hereinafter referred to as SBD) element, having an active region of an SBD provided on a main surface of a semiconductor substrate and a Phosphorus Silicate Glass (PSG) film covering region provided on an outer peripheral portion from an end of the active region, are provided with an organic final passivation film and an Under Bump Metal (UBM) layer that are complementarily provided on an aluminum metal film that constitutes an anode electrode, and the anode electrode and a field plate electrode are formed of a multi-layered aluminum metal including a lower aluminum metal film, an aluminum diffusion barrier metal film, an upper aluminum metal film, and the like.

Accordingly, the occurrence of cracks can be prevented.

In addition, WO 2014/084124 (Patent Literature 3) proposes a structure in which an edge termination region that surrounds an outer periphery of an active region has an electric field relaxing structure including guard rings, first field plates in contact with the guard rings, and second field plates provided on the first field plates with interlayer insulating films interposed therebetween, a thickness of the second field plate is larger than a thickness of the first field plate, a gap between the second field plates is greater than a gap between the first field plates, barrier metal films that are in conductive contact with the second field plates are provided between the second field plates and the interlayer insulating films, and a gap between the barrier metal films is equal to the gap between the first field plates.

Accordingly, the shielding effect against external electric charges can be enhanced.

However, as a result of examination by the inventors of the present application, a problem of galvanic corrosion has been found in which dissimilar metals become local batteries and corrode under a hot and humid environment when a part of the barrier metal layer protrudes from both sides of the field electrode in the direction crossing the termination region, as in Patent Literatures 1 and 3.

Galvanic corrosion is local corrosion caused by a difference in standard potential between dissimilar metals, and satisfies the following Formula 1.

$$P = P0 \cdot (1 + A/B) \qquad \text{(Formula 1)}$$

Here, P is a corrosion amount, P0 is a corrosion amount of a single metal, A is an area of a metal with a high standard potential, B is an area of a metal with a low standard potential. The area in this formula is a surface area.

In Patent Literatures 1 and 3, a standard potential of the barrier metal layer is high, and a standard potential of the field electrode made of an aluminum alloy is low, and thus the A/B (area of the barrier metal layer/area of the field electrode) in the above Formula 1 is large, so that galvanic corrosion is accelerated and a problem remains in reliability under a hot and humid environment.

In addition, in a three-layer structure of Al/barrier metal film/Al as in Patent Literature 2, when the barrier metal film does not protrude and end positions coincide, a surface area of Al on an upper layer side refers to those of an upper surface portion and a side surface portion, whereas a surface area of the barrier metal film or an surface area of Al on a lower layer side only refer to that of a side surface portion, so that the Al on the lower layer side has a smaller surface area than the Al on the upper layer side. Therefore, the A/B (area of barrier metal film/area of field electrode) of the above Formula 1 is larger in the Al on the lower layer than in the Al on the upper layer side, and thus there is a problem that galvanic corrosion is more likely to occur in the Al on the lower layer side than in the Al on the upper layer side.

SUMMARY OF THE INVENTION

An object of the invention is to provide a highly reliable semiconductor device having a termination structure in which a semiconductor active region is surrounded with a guard ring and capable of preventing corrosion of a metal layer connected to the guard ring and a power conversion device using the semiconductor device.

In order to solve the above problems, the invention provides a semiconductor device including an active region formed on a main surface of a semiconductor substrate; and a guard ring region formed on the main surface so as to surround the active region, the guard ring region includes a guard ring formed on the semiconductor substrate, an interlayer insulating film formed on the semiconductor substrate so as to cover the guard ring, a field plate disposed on the interlayer insulating film and electrically connected to the guard ring via a contact penetrating the interlayer insulating film, and a protective film covering the field plate, the field plate has a laminated structure including a first metal in contact with the guard ring and a second metal which is disposed in contact with the first metal and has a lower standard potential than the first metal, and a ratio of a contact area of the first metal with the protective film to a contact area of the second metal with the protective film is 0.05 or less.

In addition, the invention provides a power conversion device including: a pair of DC terminals; AC terminals of the same number as the number of AC phases; and power conversion units of the same number as the number of AC phases, the power conversion units are connected between the pair of DC terminals, and are each configured by connecting, in series, two parallel circuits in each of which a switching element and a diode having polarity reverse to that of the switching element are connected in parallel, interconnection points of the parallel circuits are connected to different AC terminals, and the switching element is the above-described semiconductor device.

According to the invention, a semiconductor device having a termination structure in which a semiconductor active region is surrounded with a guard ring and capable of preventing corrosion of a metal layer connected to the guard ring can be provided.

Accordingly, the semiconductor device and the power conversion device using the semiconductor device can be improved in reliability and extended in service life.

Problems, configurations, and effects other than those described above will become apparent from the following description of embodiments.

DESCRIPTION OF THE PREFERRED EMBODIMENTS

Figure 1:
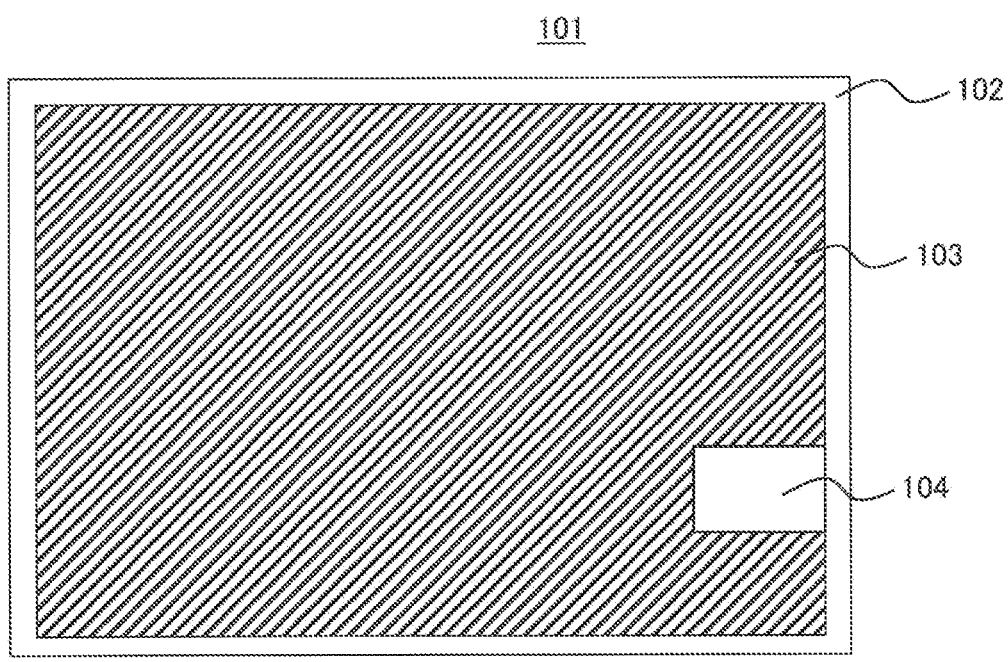
FIG. 1 is a top view of a semiconductor device (IGBT semiconductor chip) according to Embodiment 1 of the invention.

Hereinafter, embodiments of the invention will be described in detail with reference to the drawings. In the drawings, those having the same reference numerals indicate the same constituent elements or constituent elements having similar functions. In addition, p−, p, p+ indicate that a conductive type of a semiconductor layer is a p type, and relative impurity concentrations increase in this order. Similarly, n−, n, n+ indicate that a conductive type of the semiconductor layer is an n type, and relative impurity concentrations increase in this order.

Embodiment 1

A semiconductor device according to Embodiment 1 of the invention and a manufacturing method thereof will be described with reference to FIGS. 1 to 7.

FIG. 1 is a top view of an IGBT semiconductor chip 101, which is the semiconductor device according to Embodiment 1. An active region 103 of an IGBT is provided at a center of the chip. In addition, a gate electrode PAD 104 for applying a gate voltage of the IGBT is provided. A chip termination guard ring region 102 is provided on an outer periphery of the IGBT semiconductor chip 101.

Figure 2:
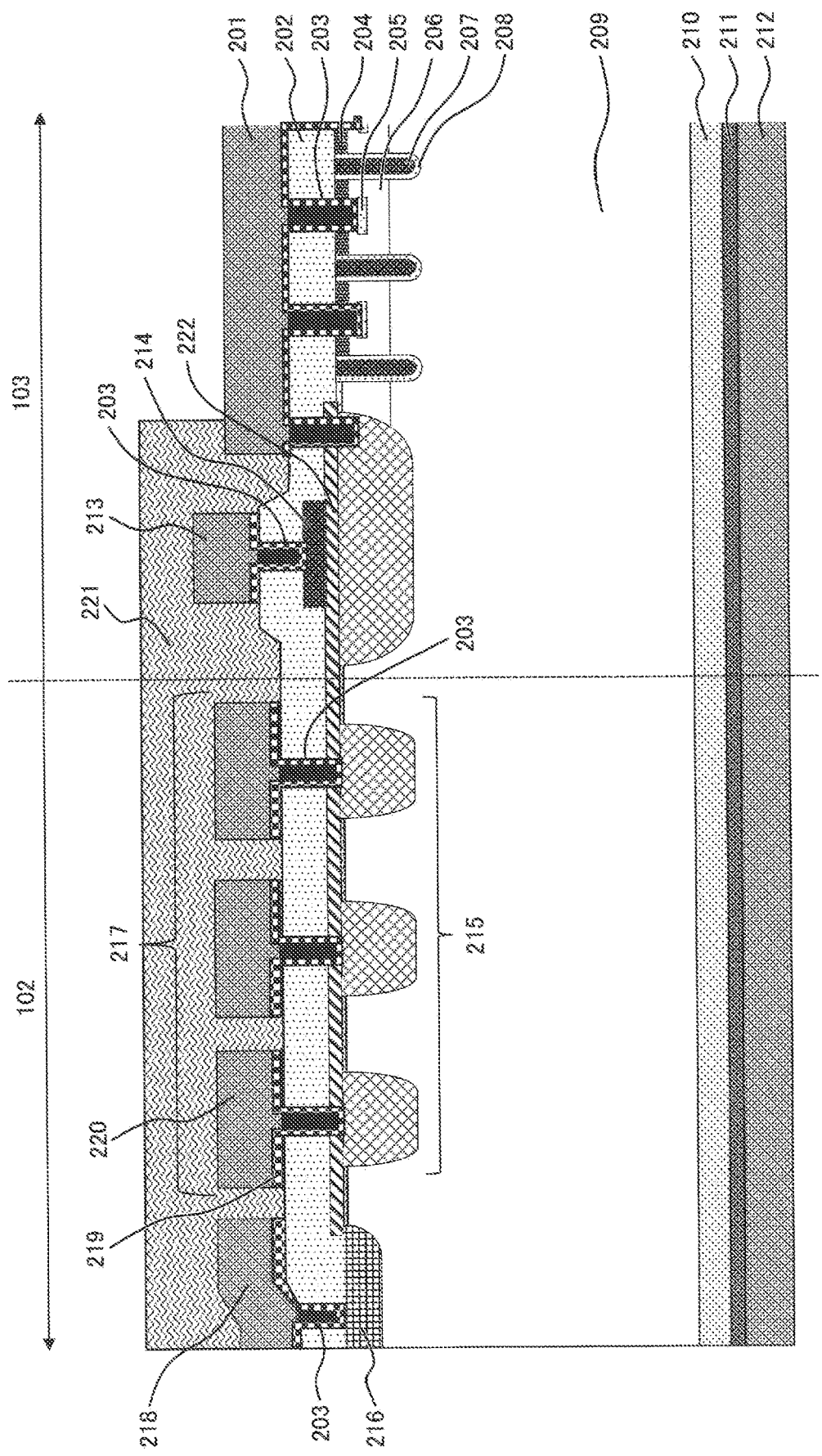
FIG. 2 is a cross-sectional view of the semiconductor device according to Embodiment 1 of the invention.

FIG. 2 is a cross-sectional view of the active region 103 and the chip termination guard ring region 102 of the IGBT semiconductor chip 101. In the active region 103, trench gates 207 are periodically arranged, and contacts 203 are provided between adjacent trench gates 207. The contact 203 penetrates an insulating layer (interlayer insulating film 202) and is connected to an emitter electrode 201 which is a first metal layer.

The trench gate 207 includes a gate insulating film 208 and polysilicon (Poly-Si) embedded in the trench, and forms a Metal-Oxide-Semiconductor Field-Effect Transistor (MOSFET) with a p base layer 206 and an n+ source layer 204 formed on a front surface of an n-semiconductor substrate 209 so as to have a function of turning on/off the IGBT semiconductor chip 101. In addition, the p base layer 206 is provided with a p+ layer 205 in order to reduce contact resistance with the contact 203.

The trench gate 207 is connected to a polysilicon gate wiring 214 on a field oxide film 222 by the polysilicon (Poly-Si) embedded in the trench, and is connected to a gate electrode 213 via the contact 203 through an insulating layer (interlayer insulating film 202).

In the chip termination guard ring region 102, a plurality of second conductive type (p type) guard rings 215 are arranged on the front surface of the n-semiconductor substrate 209, and at the chip termination, a first conductive type (n type) channel stopper 216 is disposed on the front surface of the n-semiconductor substrate 209.

Each of the plurality of second conductive type (p type) guard rings 215 is connected to a corresponding second metal layer 217 by a corresponding contact 203 through the field oxide film 222 and the insulating layer (interlayer insulating film 202). The first conductive type (n type) channel stopper 216 is connected to a third metal layer 218 by the contact 203 through the insulating layer (interlayer insulating film 202).

The second metal layer 217 covers a surface of the corresponding second conductive type (p type) guard ring 215 and has a laminated structure of at least two or more kinds of dissimilar metals, and this laminated structure of dissimilar metals is formed such that a first metal 219 is in contact with the corresponding second conductive type (p type) guard ring 215, and a second metal 220 having a lower standard potential than the first metal 219 is in contact with the first metal 219.

In addition, the second metal layer 217 connected to the second conductive type (p type) guard ring 215 and the third metal layer 218 connected to the first conductive type (n type) channel stopper 216 are covered with an organic passivation film (protective film) 221.

Here, the laminated structure of the first metal 219 and the second metal 220 is formed such that a ratio of a contact area of the first metal 219 with the organic passivation film (protective film) 221 to a contact area of the second metal 220 with the organic passivation film (protective film) 221 is 0.05 or less.

An n type buffer layer 210, a p type collector layer 211, and a collector electrode 212 are formed in this order on a back surface of the n-semiconductor substrate 209, that is, on a main surface (back surface) of the n-semiconductor substrate 209 opposite to a main surface (front surface) on a side where the trench gates 207 are formed.

A relation between the first metal 219 and the second metal 220 will be described in detail with reference to FIGS. 3 to 6. For ease of explanation, FIGS. 3 and 5 show a state before the second metal layer 217 is covered with the organic passivation film (protective film) 221, that is, a state in which an upper surface and a side surface of the second metal 220 and an upper surface and a side surface of the first metal 219 that are not covered with the second metal 220 are exposed.

Figure 3B:
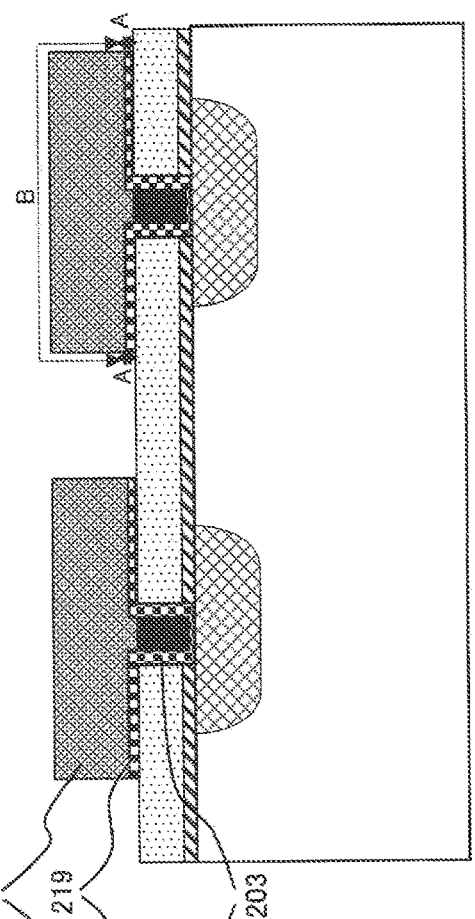
FIGS. 3A and 3B are schematic views showing a first metal and a second metal in a cross-section of a main part of a guard ring portion.
Figure 3A:
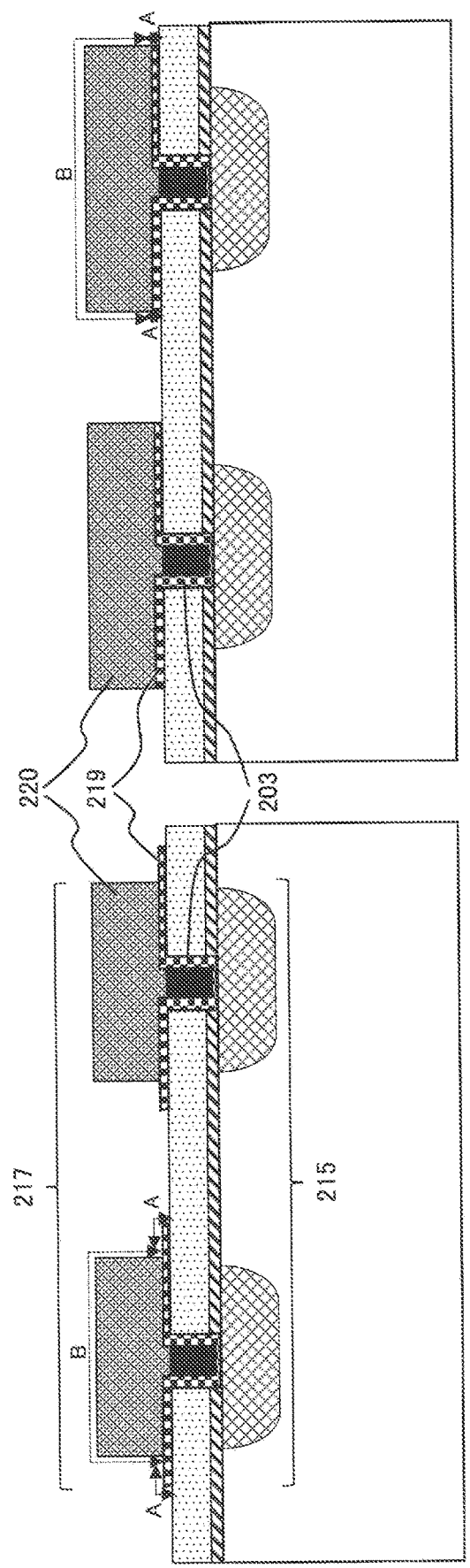

FIGS. 3A and 3B are schematic views showing a relation between an exposed surface area A of the first metal 219 and an exposed surface area B of the second metal 220 in a cross-section of a main part of a guard ring portion. FIG. 3A shows a case where the ratio of the exposed surface area A of the first metal 219 to the exposed surface area B of the second metal 220 is large, and FIG. 3B shows a case where the ratio of the exposed surface area A of the first metal 219 to the exposed surface area B of the second metal 220 is small.

Figure 4:
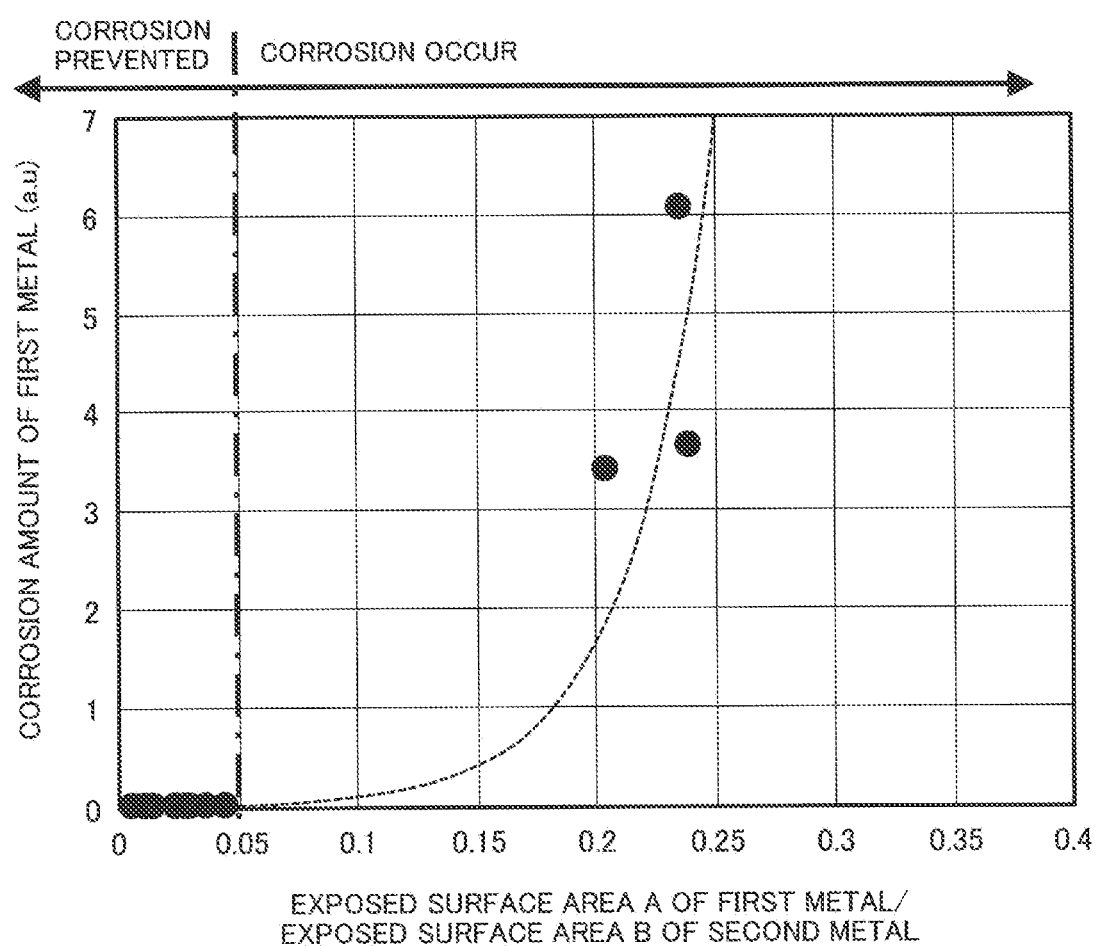
FIG. 4 is a diagram showing an effect of the invention.

FIG. 4 is a characteristic diagram showing a relation between a corrosion amount of the first metal 219 and the ratio of the exposed surface area A of the first metal 219 to the exposed surface area B of the second metal 220. According to the examination of the inventors of the present application, it was found that since the above-mentioned galvanic reaction satisfies Formula (1), corrosion of the first metal 219 can be prevented when the ratio of the exposed surface area A of the first metal 219 to the exposed surface area B of the second metal 220 is 0.05 or less as shown in FIG. 4.

Figure 5B:
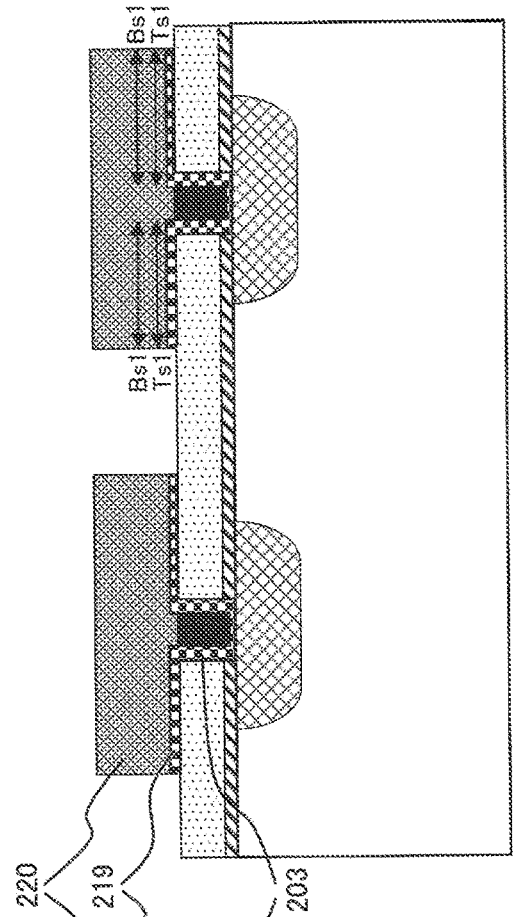
FIGS. 5A and 5B are schematic views showing a first metal and a second metal in a cross-section of a main part of a guard ring portion.
Figure 5A:
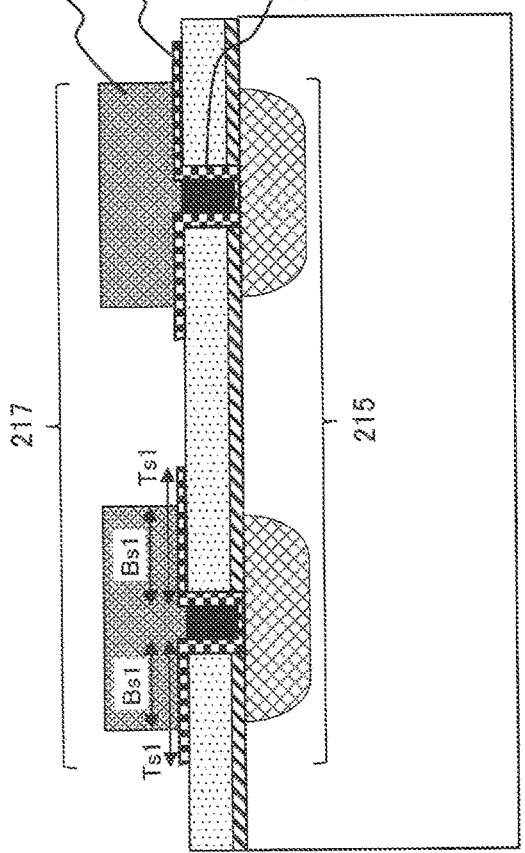

FIGS. 5A and 5B are schematic views showing a percentage of an area Ts1 of an upper surface of the first metal 219 that is covered with an area Bs1 of the second metal 220 in a cross-section of a main part of a guard ring portion. FIG. 5A shows a case where the percentage of the upper surface of the first metal 219 (area Ts1) that is covered with the second metal 220 (area Bs1) is small, and FIG. 5B shows a case where the percentage of the upper surface of the first metal 219 (area Ts1) that is covered with the second metal 220 (area Bs1) is large.

Figure 6:
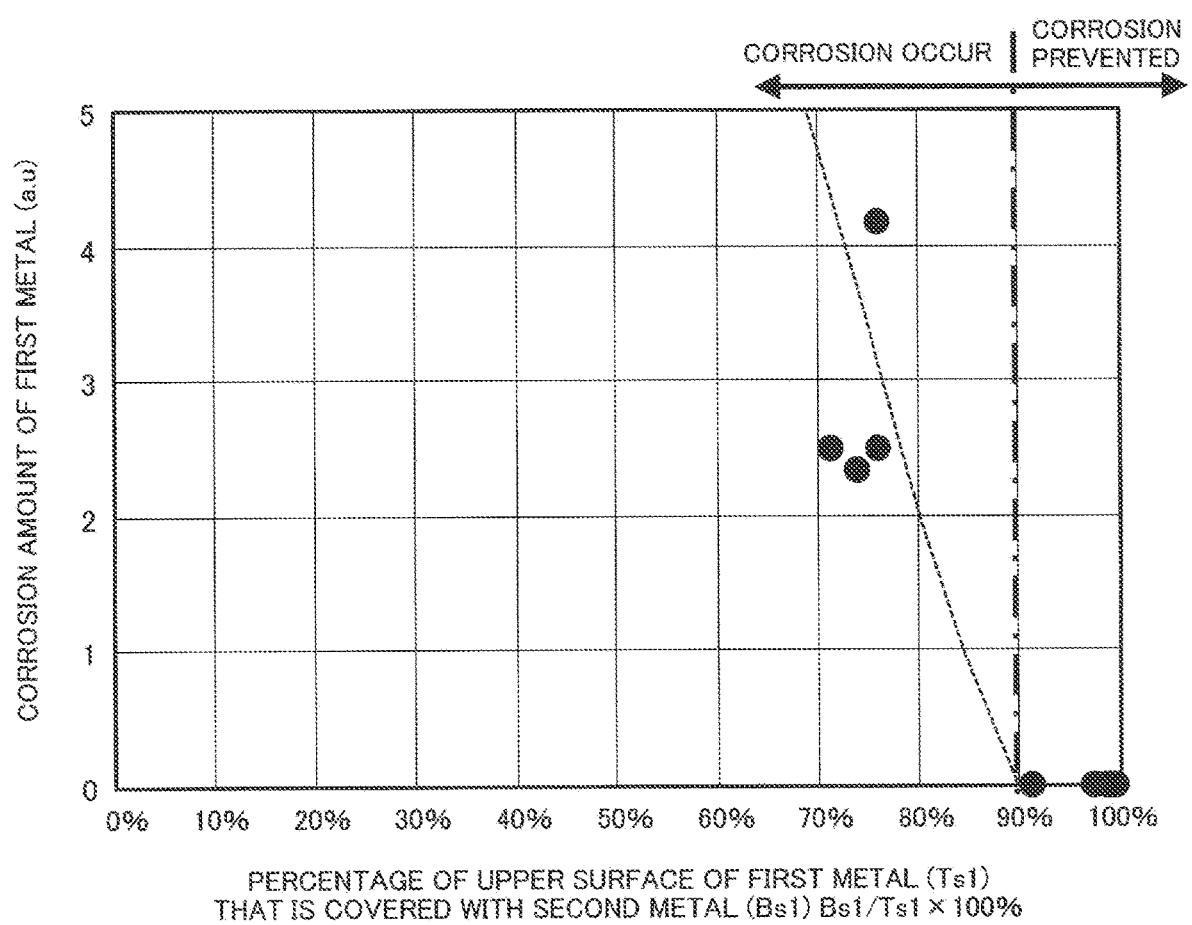
FIG. 6 is a diagram showing an effect of the invention.

FIG. 6 is a characteristic diagram showing a relation between a corrosion amount of the first metal 219 and the percentage of the upper surface of the first metal 219 (area Ts1) that is covered with the second metal 220 (area Bs1). Under a hot and humid condition, bromine ions ($Br^-$), chlorine ions ($Cl^-$), fluorine ions ($F^-$) or the like remaining in a package or in a wafer processing step dissolve in moisture, and these halogen components move to a + potential side of the chip termination guard ring region 102, which may cause a leak path or corrosion. In addition, the dissimilar metals become local batteries, thereby accelerating the corrosion.

According to the examination of the inventors of the present application, it was found that the corrosion of the first metal 219 can be prevented when the percentage of the upper surface of the first metal 219 (area Ts1) that is covered with the second metal 220 (area Bs1) is 90% or more, as shown in FIG. 6. In FIG. 5, Bs1 is defined in a part excluding the contact 203, but in FIG. 5, the contact 203 is continuously formed in a depth direction of a page surface, even if a broken portion exists in the contact 203, the portion is about 1% of the whole, and thus a calculation result shown in FIG. 6 is within an error range.

FIGS. 7A to 7F are diagrams showing a manufacturing process of the IGBT semiconductor chip 101 according to Embodiment 1 (FIG. 2).

Figure 7D:
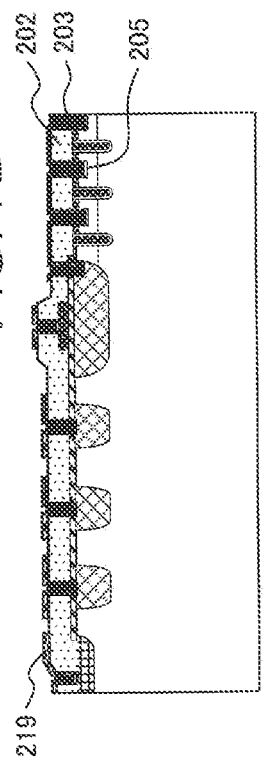
FIGS. 7A to 7F are cross-sectional views showing a manufacturing process of the semiconductor device according to Embodiment 1 of the invention.
Figure 7E:
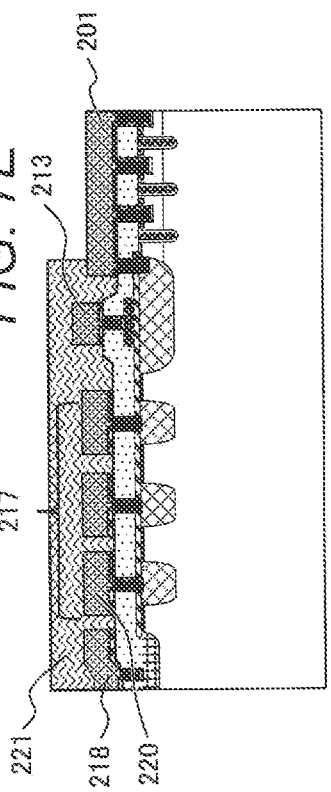
Figure 7F:
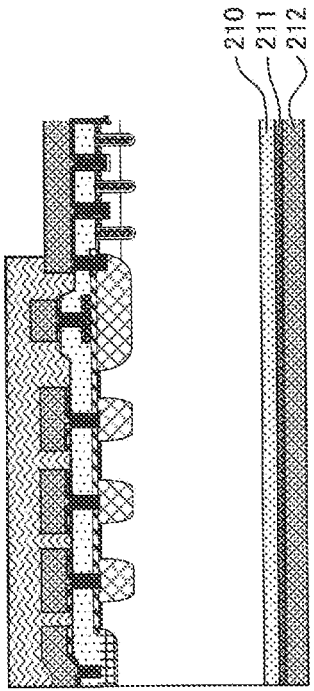
Figure 7A:
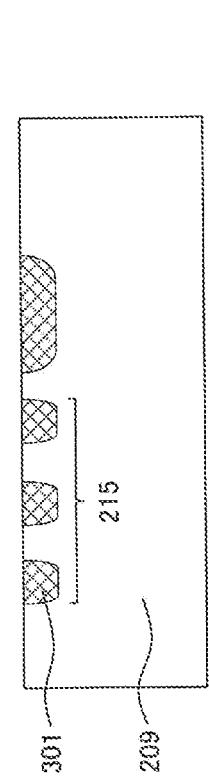

FIG. 7A Formation of P-Well

First, an n-semiconductor substrate 209 (for example, a semiconductor wafer such as a Si wafer) is prepared.

Next, an insulating film (for example, a $SiO_2$ film) is formed on the main surface (front surface) of the n-semiconductor substrate 209, a photoresist is applied on the insulating film, and then the photoresist is patterned for forming a P-well 301 by photolithography.

Next, the patterned photoresist is used as a mask, p type impurities (for example, boron) are implanted into the n-semiconductor substrate 209 by ion implantation, the photoresist is removed, and then the p type impurities are diffused by annealing to form the P-well 301. The P-well 301 configures the second conductive type (p type) guard ring 215 in the chip termination guard ring region 102, and constitutes a p type layer for potential stabilization under the polysilicon gate wiring 214 in the active region 103.

Figure 7B:
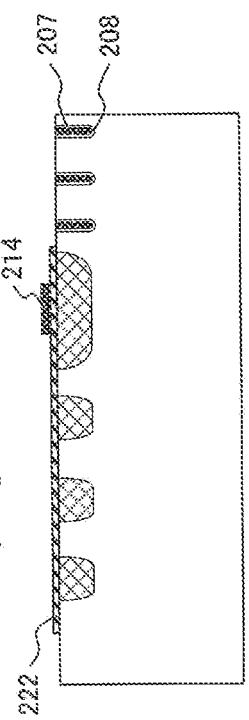

FIG. 7B Formation of Trench Gate

Next, an insulating film (for example, a $SiO_2$ film) is formed on the main surface (front surface) of the n-semiconductor substrate 209, a photoresist is applied on the insulating film, and then the photoresist is patterned for forming the field oxide film 222 by photolithography. After the photoresist is removed, the patterned insulating film is used as a mask, and a thermal oxidation treatment is performed on the main surface (surface) of the n-semiconductor substrate 209 to selectively form the field oxide film 222 on the main surface (surface) of the n-semiconductor substrate 209.

After the patterned insulating film is removed, an insulating film (for example, a $SiO_2$ film) is formed on the main surface (front surface) of the n-semiconductor substrate 209, a photoresist is applied on the insulating film, and then the photoresist and the insulating film are patterned for forming a trench by photolithography. After the photoresist is removed, a trench is formed by anisotropic etching using the patterned insulating film as a mask.

Next, the gate insulating film 208 is formed in the trench, then a polysilicon film is deposited so as to be embedded in the trench, and the trench gate 207 and the polysilicon gate wiring 214 are processed and formed by photolithography.

Figure 7C:
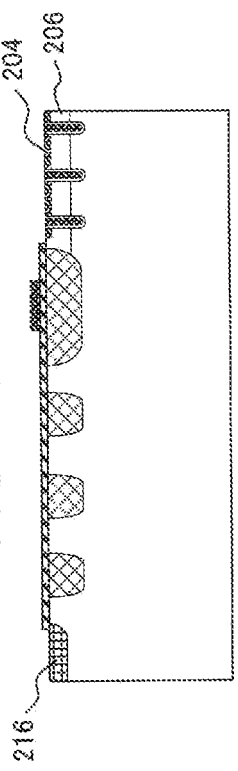

FIG. 7C Formation of P Base Layer, N+ Source Layer, Channel Stopper

Next, a photoresist patterned for forming the p base layer 206 is used as a mask, p type impurities are ion-implanted and further a heat treatment is performed so as to form the p base layer 206.

Subsequently, a photoresist patterned for forming the n+ source layer 204 and the first conductive type (n type) channel stopper 216 is used as a mask, n type impurities are ion-implanted so as to form the n+ source layer 204 and the first conductive type (n type) channel stopper 216.

FIG. 7D Formation of Contact

Next, the interlayer insulating film 202 is deposited on the main surface (front surface) of the n-semiconductor substrate 209, and the interlayer insulating film 202 is flattened. For flattening, for example, reflow of Boron-Phosphors Silicate Glass (BPSG) film or flattening methods such as Chemical Mechanical Polishing (CMP) is applied.

Contact holes are formed by photolithography and anisotropic etching after the interlayer insulating film 202 is flattened. At this time, the contact holes penetrate the interlayer insulating film 202 and further reach the p base layer 206, the P-well 301, the polysilicon gate wiring 214, and the first conductive type (n type) channel stopper 216. As a result, when the p base layer 206 is viewed in cross-section, a pair of n+ source layers 204 are formed, and a groove portion in contact with a contact metal layer formed in the subsequent process is formed.

Subsequently, the interlayer insulating film 202 in which the contact holes are formed is used as a mask, and p type impurities are ion-implanted so as to form the p+ layer 205 at a bottom of the contact holes.

Next, a metal, such as Mo, TiW, TiN, Ti, Co, Ni, that serves as a barrier layer of the Al electrode and can react with Si to reduce resistance of a Si contact surface is formed into a film by, for example, sputtering, and annealed so as to form a silicide layer.

Next, a metal film made of a high hardness and high melting point metal such as W is embedded in the contact holes, and further the metal film is etched or flattened by CMP so as to form the contact metal layer (contact 203). At this time, a portion other than the contact holes is not removed even after the flattening of W, and remains on the interlayer insulating film 202.

Here, the metal serving as the barrier layer of the Al electrode is preferably a metal having a small potential difference with the standard potential of Al (−1.66 V) in order to prevent the galvanic reaction. For example, a standard potential of Ti is −1.63 V, a standard potential of Co is −0.277 V, a standard potential of Ni is −0.23 V, and a standard potential of Mo is −0.2 V.

FIG. 7E Formation of Electrode and Organic Passivation Film on Front Surface

Thereafter, a metal layer containing aluminum (Al) as a main component is deposited, and the emitter electrode 201 which is the first metal layer, the second metal layer 217, and the gate electrode 213 are formed by photolithography and etching. The aluminum is etched by anisotropic dry etching, and at the same time, the barrier layer is also processed and formed.

As a result, the percentage of the area Ts1 on the upper surface of the first metal 219 (for example, Ti), which is the barrier layer, that is covered with the area Bs1 of the second metal 220 (Al) is large, the galvanic reaction can be prevented, and the corrosion of the barrier layer (first metal 219) can be prevented.

In addition, the ratio of the exposed surface area A of the first metal 219 (barrier layer: for example, Ti) to the exposed surface area B of the second metal 220 (Al) is decreased, and similarly, the galvanic reaction can be prevented, and the corrosion of the barrier layer (first metal 219) can be prevented.

Moreover, since the second metal layer 217 covers the surface of the second conductive type (p type) guard ring 215, and the shielding effect against moisture or external electric charges such as ionic substances, and movable ions can be enhanced, a potential of the n-semiconductor substrate 209 during application of a high voltage is stabilized, the electric field is less likely to fluctuate, and a blocking voltage is stabilized.

Thereafter, the organic passivation film 221 made of polyimide or the like is formed, and patterned so as to expose the emitter electrode 201.

The above steps FIGS. 7A to 7E are a front surface-side process of the n-semiconductor substrate 209.

FIG. 7F Formation of N Buffer, P Collector Layer, Collector Electrode on Back Surface Next, the n-semiconductor substrate 209 is ground to a desired thickness from the back surface side thereof by back grinding. Thereafter, n type and p type impurities are ion-implanted into the n-semiconductor substrate 209 from the back surface side of the n-semiconductor substrate 209, and laser annealing is further performed so as to form the n type buffer layer 210 and the p type collector layer 211.

By appropriately adjusting acceleration energy at the time of ion implantation, the n type buffer layer 210 and the p type collector layer 211 having different depths from the back surface of the n semiconductor substrate 209 can be formed.

Thereafter, a laminated metal layer, for example, Al—Ti—Ni—Au is formed by sputtering on the back surface side of the n-semiconductor substrate 209 so as to form the collector electrode 212.

In the semiconductor device of the present embodiment, the second metal layer 217 covers the surface of the second conductive type (p type) guard ring 215, and the shielding effect against moisture or external electric charges such as ionic substances, and movable ions can be enhanced. Therefore, the potential of the n-semiconductor substrate 209 during the application of the high voltage is stabilized, the electric field is less likely to fluctuate, and the blocking voltage can be stabilized.

In addition, the second metal layer 217 has a laminated structure of dissimilar metals, the laminated structure of dissimilar metals is formed such that the first metal 219 is in contact with the second conductive type (p type) guard ring 215, and the second metal 220 having a lower standard potential than the first metal 219 is in contact with the first metal 219, 90% or more of the area of the upper portion of the first metal 219 is covered with the second metal 220, and the percentage of the area Ts1 on the upper surface of the first metal 219 (barrier Layer, for example, Ti) that is covered with the area Bs1 of the second metal 220 (Al) is large, so that the galvanic reaction can be prevented, and the corrosion of the barrier layer (first metal 219) can be prevented.

In addition, the ratio of the exposed surface area A of the first metal 219 (barrier layer: for example, Ti) to the exposed surface area B of the second metal 220 (Al) is decreased, and similarly, the galvanic reaction can be prevented, and the corrosion of the barrier layer (first metal 219) can be prevented.

In addition, the chip termination guard ring region 102 is covered with the organic passivation film 221, and the surface is mechanically protected and is protected against moisture or external electric charges such as ionic substances, and movable ions.

As described above, the semiconductor device according to the present embodiment includes the active region 103 formed on the main surface of the n-semiconductor substrate 209 and the chip termination guard ring region 102 formed on the main surface of the n-semiconductor substrate 209 so as to surround the active region 103. The chip termination guard ring region 102 includes the second conductive type (p type) guard rings 215 formed on the n-semiconductor substrate 209, the interlayer insulating film 202 formed on the n-semiconductor substrate 209 so as to cover the second conductive type (p type) guard rings 215, the field plates (second metal layers 217) disposed on the interlayer insulating film 202 and electrically connected to the second conductive type (p type) guard rings 215 via the contacts 203 penetrating the interlayer insulating film 202, and an organic passivation film (protective film) 221 covering the field plates (second metal layers 217). The field plate (second metal layer 217) has a laminated structure including the first metal 219 in contact with the second conductive type (p type) guard ring 215 and the second metal 220 which is disposed in contact with the first metal 219 and has a lower standard potential than the first metal 219. The ratio of the contact area of the first metal 219 with the organic passivation film (protective film) 221 to the contact area of the second metal 220 with the organic passivation film (protective film) 221 is 0.05 or less.

In addition, 90% or more of the area of the upper surface of the first metal 219 is covered with the second metal 220.

In addition, the chip termination guard ring region 102 includes the first conductive type (n type) channel stopper 216 formed on the n-semiconductor substrate 209 so as to surround the second conductive type (p type) guard rings 215.

Therefore, it is possible to provide a highly reliable semiconductor device that prevents the corrosion of the metal layer connected to the guard ring under a hot and humid environment, and prevents the withstand voltage deterioration and the leakage current increase during a long-term operation under a hot and humid environment and a power conversion device using the semiconductor device.

It is more desirable that almost all (about 100%) of the upper surface of the first metal 219 is covered with the second metal 220, and the ends of the first metal 219 and the ends of the second metal 220 are aligned when the field plate (second metal layer 217) is viewed in cross section. Accordingly, galvanic corrosion of the field plate (second metal layer 217) can be prevented.

In addition, it is preferable that both ends of the field plate (second metal layer 217) protrude from both ends of the second conductive type (p type) guard ring 215 when the IGBT semiconductor chip 101 is viewed in cross-section. This is because the electric field relaxation effect of the field plate (second metal layer 217) at the end of the chip can be enhanced.

Moreover, in the present embodiment (FIG. 2), an example is shown in which a plurality of second conductive type (p type) guard rings 215 are formed on the n-semiconductor substrate 209, and the plurality of second conductive type (p type) guard rings 215 are respectively connected to a plurality of field plates (second metal layer 217) via a plurality of contacts 203, but the number of combinations of the second conductive type (p type) guard ring 215 and the field plate (second metal layer 217) is not limited thereto.

For example, a case may be configured such that the second conductive type (p type) guard ring 215 and the field plate (second metal layer 217) are formed in a one-to-one manner in the chip termination guard ring region 102, or a case may be configured such that a plurality of second conductive type (p type) guard rings 215 are formed on the n-semiconductor substrate 209, and are connected, via a plurality of contacts 203, to one field plate (second metal layer 217) having an area large enough to cover all of the plurality of second conductive type (p type) guard rings 215.

In either case, galvanic corrosion of the field plate (second metal layer 217) can be prevented by configuring the area of the first metal 219 and the area of the second metal 220 constituting the field plate (second metal layer 217) as described above.

Embodiment 2

A semiconductor device according to Embodiment 2 of the invention will be described with reference to FIG. 8.

Figure 8:
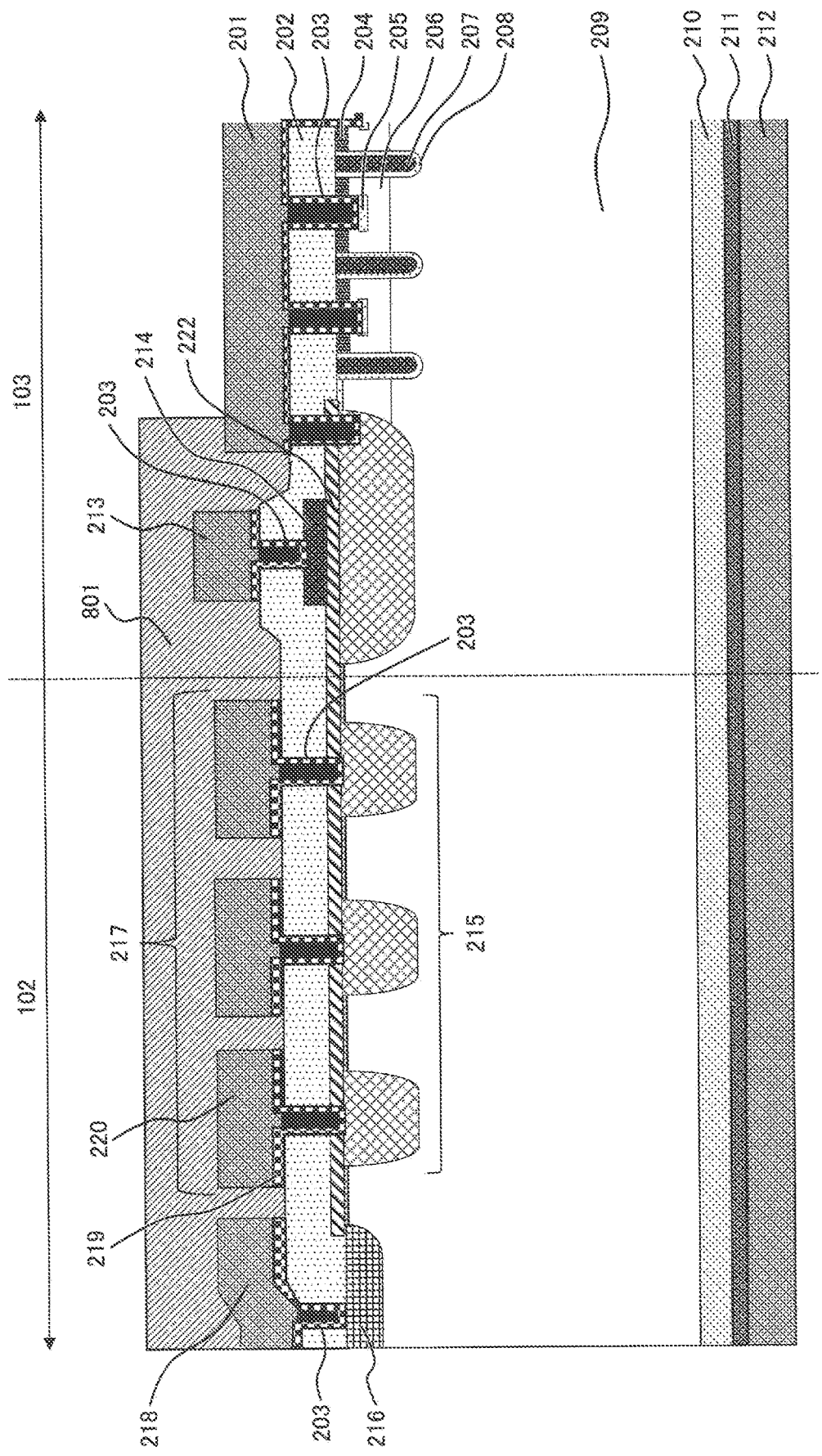
FIG. 8 is a cross-sectional view of a semiconductor device according to Embodiment 2 of the invention.

FIG. 8 is a cross-sectional view of the IGBT semiconductor chip 101 according to Embodiment 2, and corresponds to a modification of Embodiment 1 (FIG. 2).

The present embodiment is different from Embodiment 1 in that the chip termination guard ring region 102 according to Embodiment 1 (FIG. 2) is covered with the organic passivation film 221 which is a protective film, whereas the chip termination guard ring region 102 according to the present embodiment (FIG. 8) is covered with an inorganic passivation film 801. Other configurations are the same as those in Embodiment 1 (FIG. 2). Since the organic passivation film 221 is hygroscopic and has a small effect of preventing the diffusion of moisture or ionic substances, the inorganic passivation film 801 such as SiN, SiON, $SiO_2$ is used as the protective film of the chip termination guard ring region 102, and thus the invasion of moisture and the diffusion of ionic substances can be prevented.

Since the semiconductor device according to the present embodiment can further prevent the invasion of moisture or ionic substances as compared with Embodiment 1, it is possible to provide a more highly reliable semiconductor device that prevents the corrosion of the metal layer connected to the guard ring under a hot and humid environment, and prevents the withstand voltage deterioration and the leakage current increase during a long-term operation under a hot and humid environment and a power conversion device using the semiconductor device.

Embodiment 3

Figure 9:
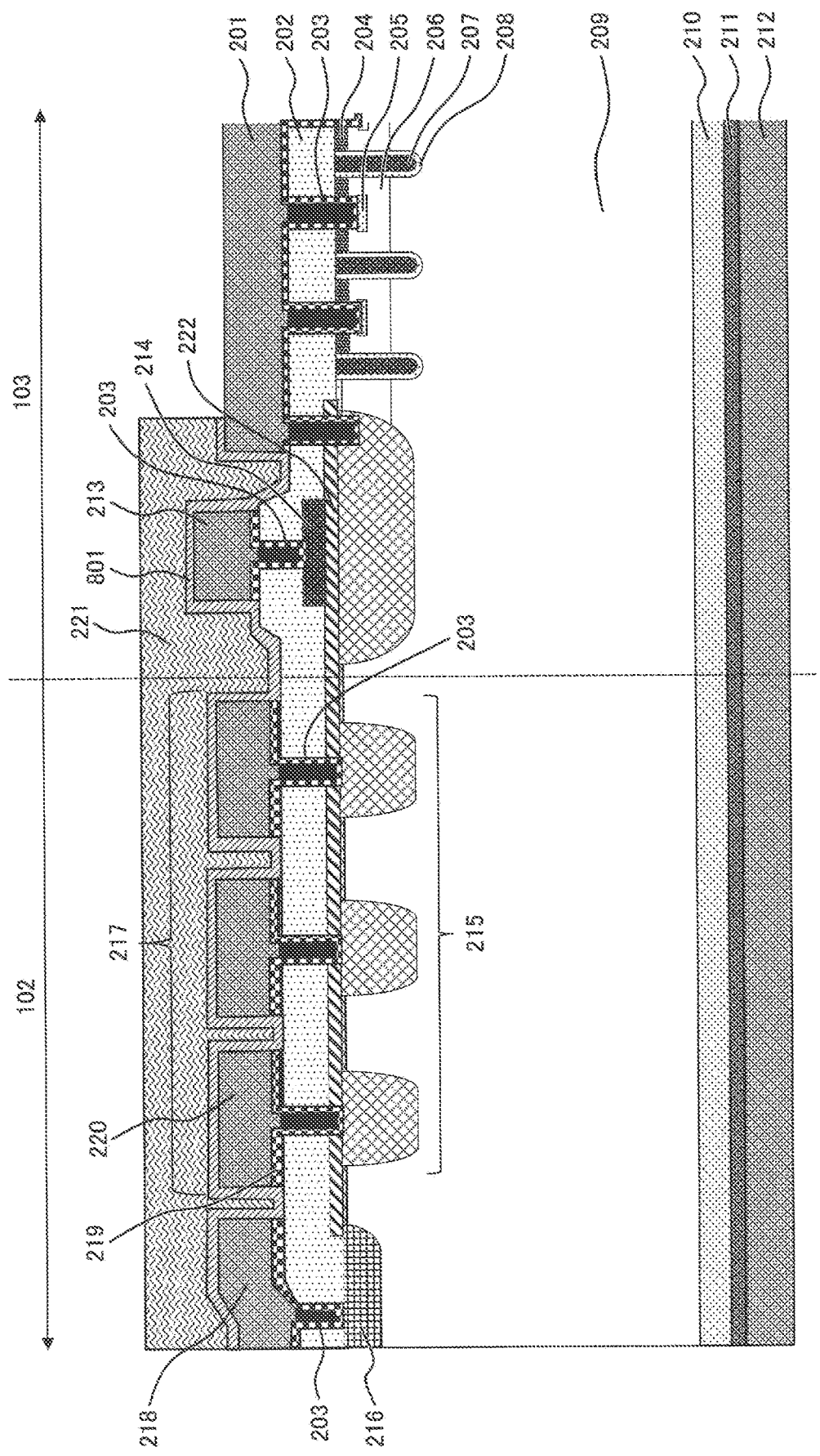
FIG. 9 is a cross-sectional view of a semiconductor device according to Embodiment 3 of the invention.

A semiconductor device according to Embodiment 3 of the invention will be described with reference to FIG. 9. FIG. 9 is a cross-sectional view of the IGBT semiconductor chip 101 according to the present embodiment, and corresponds to a modification of Embodiment 1 (FIG. 2) or Embodiment 2 (FIG. 8).

The chip termination guard ring region 102 according to the present embodiment is covered with a laminated film of the inorganic passivation film 801 and the organic passivation film 221, which is different from Embodiments 1 and 2. Other configurations are the same as in those Embodiment 1 and Embodiment 2.

The inorganic passivation film 801 is formed on the second metal layer 217. The passivation film has a function of protecting the surface mechanically and protecting the surface against moisture or external electric charges such as ionic substances, and movable ions. Thickening the passivation film is effective for mechanical surface protection.

However, the surface of the second metal layer 217 is uneven, and when the film is thickened, cracks may occur due to stress during film formation in a case where, for example, SiN is adopted as the inorganic passivation film 801. Since the cracks serve as an intrusion route of the moisture or ionic substances, the withstand voltage against external electric charges deteriorates and the leakage current increases, leading to corrosion of the barrier layer (first metal 219).

Therefore, in the present embodiment, it is possible to provide a highly reliable semiconductor device in which the second metal layer 217 is covered with a laminated film of the inorganic passivation film 801 and the organic passivation film 221, the occurrence of cracks is prevented by thinning the inorganic passivation film 801, the invasion of moisture or ionic substances can be prevented while showing a mechanical surface protection effect, further the corrosion of the metal layer connected to the guard ring under a hot and humid environment is prevented, and the withstand voltage deterioration and the leakage current increase during a long-term operation in a hot and humid environment is prevented, and a power conversion device using the semiconductor device.

Embodiment 4

Figure 10:
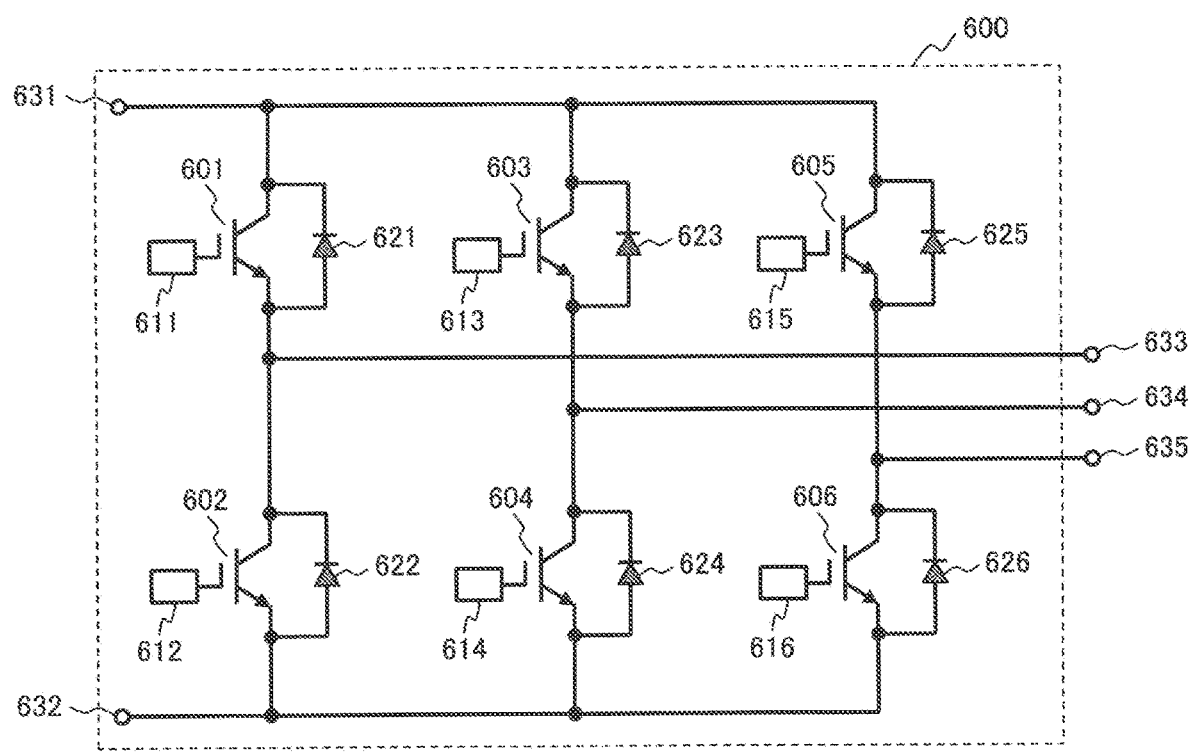
FIG. 10 is a circuit block diagram of a power conversion device according to Embodiment 4 of the invention.

An example of an embodiment in which the semiconductor device of the invention is applied to a power conversion device will be described with reference to FIG. 10. FIG. 10 is a circuit block diagram showing a power conversion device 600 that employs the semiconductor device according to any one of Embodiments 1 to 3 of the invention as components. FIG. 10 shows a circuit configuration of the power conversion device 600 according to the present embodiment, and a relation of connection between the DC power supply and a three-phase AC motor (AC load).

In the power conversion device 600 according to the present embodiment, the semiconductor device according to any one of Embodiments 1 to 3 is used for power switching elements 601 to 606. The power switching elements 601 to 606 are, for example, IGBTs.

As shown in FIG. 10, the power conversion device 600 according to the present embodiment includes a P terminal 631 and an N terminal 632 which are a pair of DC terminals, and a U terminal 633, a V terminal 634, and a W terminal 635 which are AC terminals of the same number as the number of phases of AC output.

In addition, a switching leg is provided in which a pair of power switching elements 601 and 602 are connected in series and the U terminal 633 connected to a series connection point of the power switching elements 601 and 602 is set as an output. A switching leg having a similar configuration is provided in which the power switching elements 603 and 604 are connected in series and the V terminal 634 connected to a series connection point of the power switching elements 603 and 604 is set as an output. A switching leg having a similar configuration is provided in which the power switching elements 605 and 606 are connected in series and the W terminal 635 connected to a series connection point of the power switching elements 605 and 606 is set as an output.

The three-phase switching legs including the power switching elements 601 to 606 are connected between the DC terminals of the P terminal 631 and the N terminal 632, and is supplied with DC power from a DC power supply (not shown). The U terminal 633, V terminal 634, and W terminal 635, which are three-phase AC terminals of the power conversion device 600, are connected to a three-phase AC motor (not shown) as a three-phase AC power supply.

Diodes 621 to 626 are connected in antiparallel to the power switching elements 601 to 606 respectively. Gate input terminals of the power switching elements 601 to 606 implemented by the IGBTs are respectively connected to gate drive circuits 611 to 616, and are respectively driven and controlled by the gate drive circuits 611 to 616.

That is, the power conversion device 600 according to the present embodiment is a power conversion device that receives DC power from the outside, converts the received DC power into AC power, and outputs the AC power. The power conversion device 600 includes a pair of DC terminals 631,632 for receiving DC power, and the AC terminals 633 to 635 that are AC terminals for outputting AC power and that have the same number as the number of AC phases of the AC power. For each of the AC terminals 633 to 635 of the number corresponding to the number of phases, between one terminal (p terminal 631) and the other terminal (n terminal 632) of the pair of DC terminals 631,632, a series circuit (for example, a series circuit of a parallel circuit of the power switching element 601 and the diode 621 and a parallel circuit of the power switching element 602 and the diode 622) is connected which is configured by connecting, in series, two parallel circuits (for example, a parallel circuit of the power switching element 601 and the diode 621) in each of which a switching element (for example, power switching element 601) and a diode (for example, diode 621) having polarity reverse to that of the switching element are connected in parallel, and an interconnection point of the two parallel circuits configuring the series circuit is configured to be connected to the AC terminal (for example, U terminal 633) of the phase (for example, U phase) corresponding to the series circuit.

As in the present embodiment, the reliability of the power conversion device can be improved and the service life of the power conversion device can be elongated by applying the IGBT semiconductor chip 101 described in any one of Embodiments 1 to 3 to the power switching element of the power conversion device.

The invention is not limited to the embodiments described above and includes various modifications. For example, the above embodiments have been described in detail for easy understanding of the invention, and are not necessarily limited to those including all the configurations described above. A part of the configuration of one embodiment can be replaced with the configuration of another embodiment, and the configuration of one embodiment can also be added to the configuration of another embodiment. In addition, other configurations may be added to, deleted from, or replaced with a part of the configuration of each embodiment.

What is claimed is:

1. A semiconductor device comprising:
an active region formed on a main surface of a semiconductor substrate; and
a guard ring region formed on the main surface so as to surround the active region, wherein
the guard ring region includes:
a guard ring formed on the semiconductor substrate,
an interlayer insulating film formed on the semiconductor substrate so as to cover the guard ring,
a field plate disposed on the interlayer insulating film and electrically connected to the guard ring via a contact penetrating the interlayer insulating film, and
a protective film covering the field plate,
the field plate has a laminated structure including a first metal in contact with the guard ring and a second metal which is disposed in contact with the first metal and has a lower standard potential than the first metal, and
a ratio of a contact area of the first metal with the protective film to a contact area of the second metal with the protective film is 0.05 or less.

2. The semiconductor device according to claim 1, wherein
almost all of an upper surface of the first metal is covered with the second metal, and
an end portion of the first metal and an end portion of the second metal are aligned when the field plate is viewed in cross-section.

3. The semiconductor device according to claim 1, wherein
90% or more of an area of an upper surface of the first metal is covered with the second metal.

4. The semiconductor device according to claim 1, wherein both ends of the field plate protrude from both ends of the guard ring when the semiconductor device is viewed in cross-section.

5. The semiconductor device according to claim 1, wherein
a plurality of the guard rings are formed on the semiconductor substrate, and
the contact and the field plate are formed correspondingly to each of the plurality of guard rings.

6. The semiconductor device according to claim 1, wherein
the guard ring region includes a channel stopper formed on the semiconductor substrate so as to surround the guard ring.

7. The semiconductor device according to claim 1, further comprising
a protective film covering the field plate; wherein
the protective film is any one of an organic passivation film, an inorganic passivation film, and a laminated film in which an inorganic passivation film and an organic passivation film are laminated from a lower layer in this order.

8. The semiconductor device according to claim 1, wherein
the second metal is an alloy containing Al as a main component, and
the first metal is any one of Mo, TiW, TiN, Ti, Co, and Ni.

9. The semiconductor device according to claim 1, wherein
the semiconductor device is an IGBT in which a plurality of trench gates are periodically arranged in the active region.

10. A power conversion device, comprising:
a pair of DC terminals;
AC terminals of the same number as the number of AC phases; and
power conversion units of the same number as the number of AC phases, the power conversion units being connected between the pair of DC terminals, and each being configured by connecting, in series, two parallel circuits in each of which a switching element and a diode having polarity reverse to that of the switching element are connected in parallel, and interconnection points of the parallel circuits being connected to different AC terminals; wherein
the switching element is the semiconductor device according to claim 1.

* * * * *